(12) United States Patent
Ohtomo

(10) Patent No.: US 6,835,615 B2
(45) Date of Patent: Dec. 28, 2004

(54) METHOD OF MANUFACTURING BURIED GATE MOS SEMICONDUCTOR DEVICE HAVING PIP CAPACITOR

(75) Inventor: Atsushi Ohtomo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 19 days.

(21) Appl. No.: 10/235,506

(22) Filed: Nov. 25, 2002

(65) Prior Publication Data

US 2003/0176036 A1 Sep. 18, 2003

(30) Foreign Application Priority Data

Mar. 15, 2002 (JP) ......................................... 2002-071910

(51) Int. Cl.[7] ......................................... H01L 21/8242
(52) U.S. Cl. ........................ 438/241; 438/250; 438/282; 438/589
(58) Field of Search ................................ 438/210, 241, 438/250, 270, 282, 589

(56) References Cited

U.S. PATENT DOCUMENTS

| | | | | |
|---|---|---|---|---|
| 5,108,937 A | * | 4/1992 | Tsai et al. .................... | 438/282 |
| 5,317,432 A | * | 5/1994 | Ino .............................. | 257/301 |
| 5,510,637 A | | 4/1996 | Hsu et al. .................... | 257/304 |
| 5,924,011 A | | 7/1999 | Huang ......................... | 438/239 |
| 6,323,518 B1 | | 11/2001 | Sakamoto et al. .......... | 257/330 |
| 6,492,224 B1 | * | 12/2002 | Jao .............................. | 438/241 |

FOREIGN PATENT DOCUMENTS

| | | | |
|---|---|---|---|
| JP | 05-343676 | | 12/1993 |
| JP | 06-224424 | | 8/1994 |
| JP | 11-238846 | | 8/1999 |
| JP | 11-238847 | | 8/1999 |
| JP | 2000-91344 | | 3/2000 |
| JP | 2000-216244 | | 8/2000 |
| KR | 2001-0057853 | * | 7/2001 |

* cited by examiner

Primary Examiner—Chandra Chaudhari
(74) Attorney, Agent, or Firm—Volentine Francos, PLLC

(57) ABSTRACT

A buried gate electrode of a buried MOS transistor formed within a trench in an active region wherein a gate oxide film and a gate electrode are buried in the trench, and a lower electrode of a PIP capacitor formed on a device isolation, are simultaneously formed by etching of polycrystalline silicon formed on an entire surface of the structure.

18 Claims, 3 Drawing Sheets

METHOD OF MANUFACTURING BURIED GATE MOS SEMICONDUCTOR DEVICE HAVING PIP CAPACITOR

BACKGROUND OF THE INVENTION

1. Field of the Invention

The present invention relates to a method of manufacturing an MOS semiconductor device having a parallel plate capacitor. More particularly, the present invention relates to a simultaneous formation of a parallel plate capacitor and an MOS transistor.

2. Description of the Related Art

Heretofore, in a method of manufacturing an MOS semiconductor device having a polysilicon-insulator-polysilicon polisilicon (PIP) parallel plate capacitor, an upper electrode and a lower electrode of a capacitor made of polycrystalline silicon are typically formed after forming a gate electrode of an MOS transistor in a process separate from the gate electrode forming process.

The forming method according to the prior art will be described with reference to FIG. 1. As shown in FIG. 1A, a field oxide film 102 is formed on a silicon substrate 101 by the LOCOS (Local Oxidation of Silicon) method, thereby performing the device isolation. Subsequently, after controlling the threshold values of the well forming region and the MOS transistor forming region by means of the ion implantation method and the ion diffusion method, a gate insulating film and a gate electrode film are formed. Thereafter, a gate electrode 103 is formed by the photolithography etching technique.

Then, after forming an MOS transistor by the ion implantation method and the ion diffusion method, an intermediate insulating film 104 made of a silicon oxide film is deposited on the gate electrode, and the surface thereof is planarized by the CMP (Chemical Mechanical Polishing) method. Then, a polycrystalline silicon film to be a lower electrode of a capacitor is deposited, and a lower electrode of a capacitor 105 is formed by the photolithography etching method. Subsequently, after forming a capacitor insulating film 106, a polycrystalline silicon film to be an upper electrode of a capacitor is deposited, and an upper electrode of a capacitor 107 is formed by the photolithography etching method. (FIG. 1B).

Then, after an interlayer insulating film 108 made of, for example, a silicon oxide film is deposited and planarized by the CMP method, a contact hole 109 on an active region, a contact hole 110 on the gate electrode, a contact hole 111 on the lower electrode of a capacitor, and a contact hole 112 on the upper electrode of a capacitor are formed by the photolithography etching method (FIG. 1C). Finally, after the contact holes 109, 110, 111, and 112 are buried with a buried metal 113 such as tungsten, a wiring layer 114 is formed (FIG. 1D).

In the prior art, however, since three processes for forming a gate electrode, forming a lower electrode of a capacitor, and forming an upper electrode of a capacitor are necessary, the entire process becomes complicated, and resulting in the increase of the manufacturing cost. Also, since the lower electrode of a capacitor and the upper electrode of a capacitor are formed after forming an MOS transistor, the impurity profile of the MOS transistor is influenced by the thermal treatment performed when forming the capacitor, which makes it difficult to achieve more downsizing of the MOS transistor.

SUMMARY OF THE INVENTION

For the solution of the problems described above, the present invention provides a method in which a buried electrode of a buried MOS transistor formed in a trench which is formed in an active region and a lower electrode of a capacitor formed on a device isolation are simultaneously formed by means of the etching of a polycrystalline silicon. The method makes it possible to easily manufacture an MOS semiconductor device having a fine MOS transistor and a PIP flat plate capacitor in a simple process.

BRIEF DESCRIPTIONS OF THE DRAWINGS

DESCRIPTION OF THE PREFERRED EMBODIMENTS

Figure 1A:
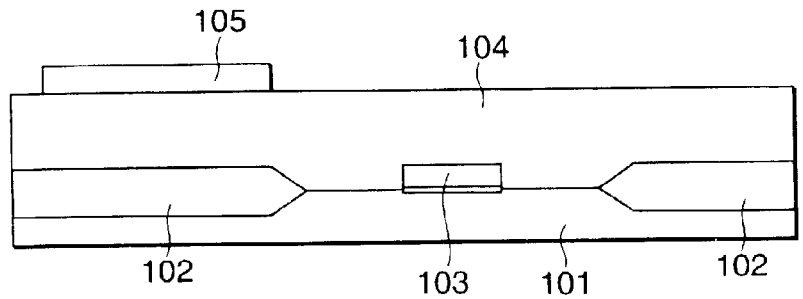
FIG. 1A is a process drawing showing a method of manufacturing a capacitor and a transistor according to the prior art.
Figure 1B:
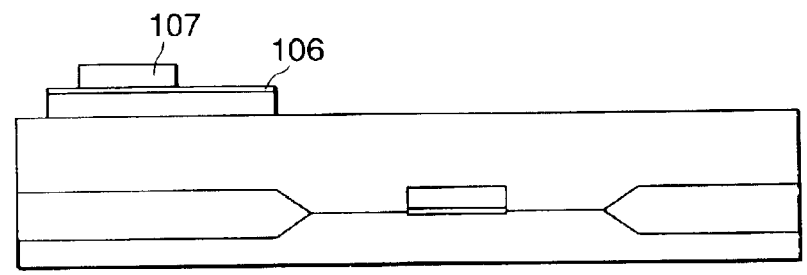
FIG. 1B is a process drawing showing a method of manufacturing a capacitor and a transistor according to the prior art.
Figure 1C:
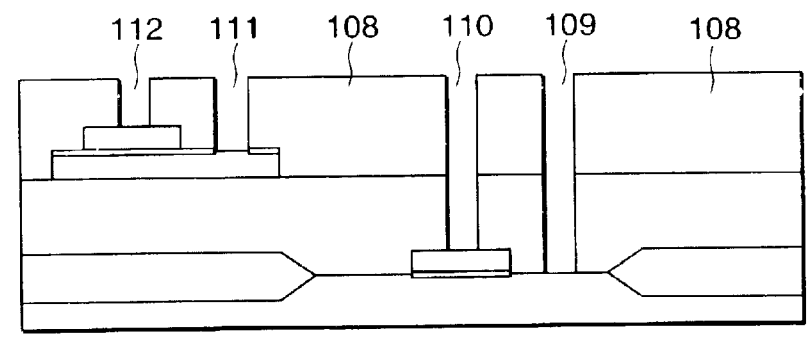
FIG. 1C is a process drawing showing a method of manufacturing a capacitor and a transistor according to the prior art.
Figure 1D:
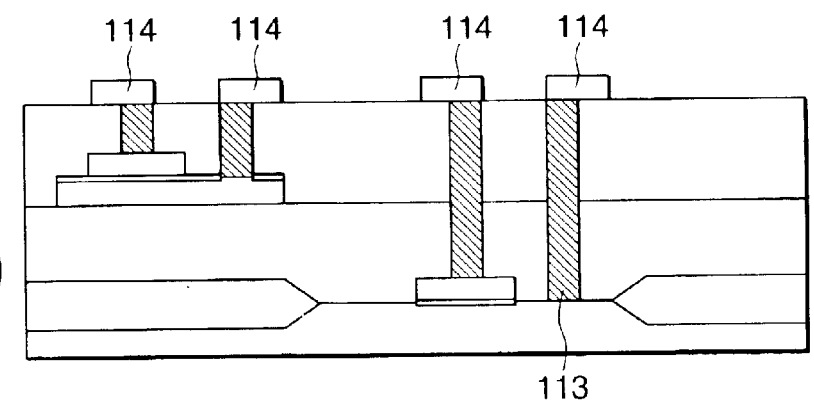
FIG. 1D is a process drawing showing a method of manufacturing a capacitor and a transistor according to the prior art.
Figure 2A:
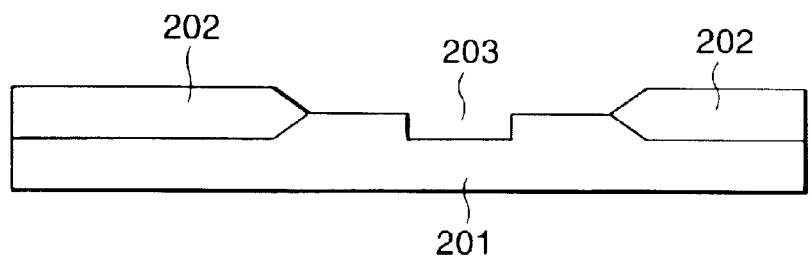
FIG. 2A is a process drawing showing a method of manufacturing a capacitor and a transistor, which is used to explain an embodiment of the present invention.
Figure 2B:
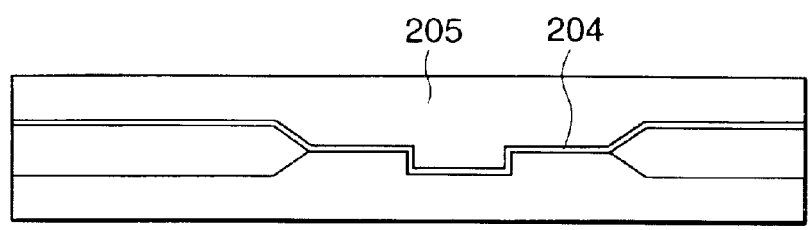
FIG. 2B is a process drawing showing a method of manufacturing a capacitor and a transistor, which is used to explain an embodiment of the present invention.

The process drawings for explaining the embodiment of the present invention are shown in FIGS. 2A to 2D and 3A to 3D. First, a silicon substrate 201 is oxidized by the LOCOS method to form a field oxide film 202, and then, a device isolation region is formed. Subsequently, a trench 203 is formed by the photolithography etching technique in an active region surrounded by the element isolation region on the silicon substrate on which a gate electrode will be formed (FIG. 2A).

Figure 2C:
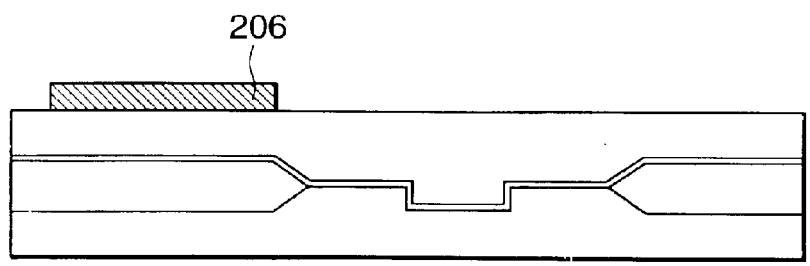
FIG. 2C is a process drawing showing a method of manufacturing a capacitor and a transistor, which is used to explain an embodiment of the present invention.
Figure 2D:
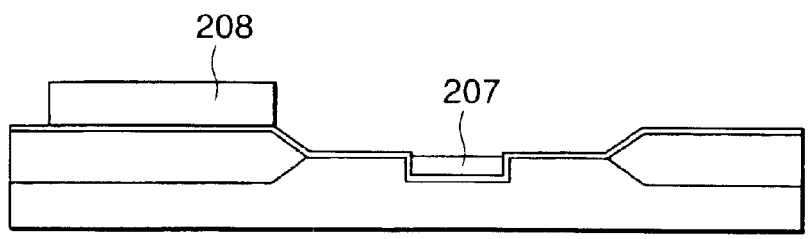
FIG. 2D is a process drawing showing a method of manufacturing a capacitor and a transistor, which is used to explain an embodiment of the present invention.

Next, after performing the ion implantation for controlling the threshold value of the regions in the active region where a well and an MOS transistor will be formed, a gate insulating film 204 and a polycrystalline silicon film 205 of an MOS transistor are formed (FIG. 2B), and only the capacitor forming region is covered with a resist 206 by means of the photolithography etching technique (FIG. 2C). Then, polycrystalline silicon 205 is buried into the trench 203 by means of the etch back method by which a buried gate electrode 207 is formed, and a lower electrode of a capacitor 208 made of polycrystalline silicon 205 is formed on the field oxide film 202. Next, the doping or the impurities into the polycrystalline silicon film 205 is performed by means of the ion implantation method. Through the processes described above, an MOS transistor with a recessed structure is formed (FIG. 2D).

Figure 3A:
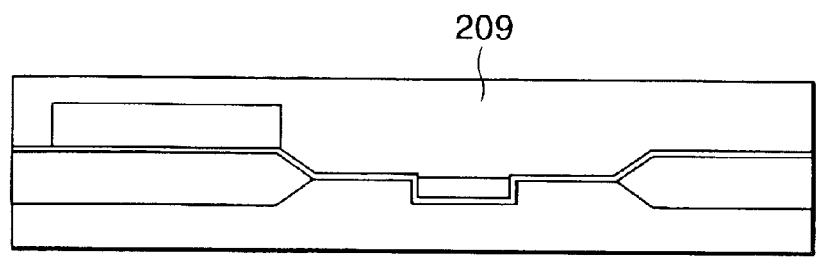
FIG. 3A is a process drawing showing the process after those shown in FIG. 2 in the manufacturing method, which is used to explain an embodiment of the present invention.
Figure 3B:
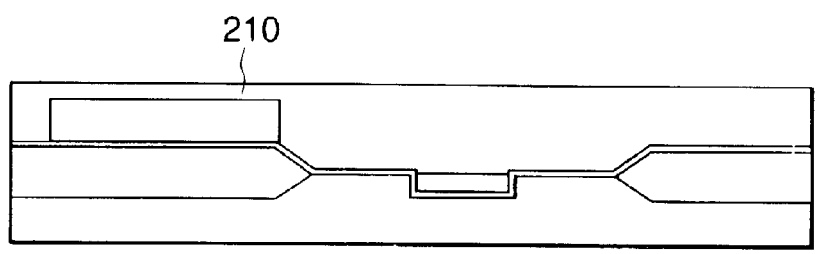
FIG. 3B is a process drawing showing the process after those shown in FIG. 2 in the manufacturing method, which is used to explain an embodiment of the present invention.
Figure 3C:
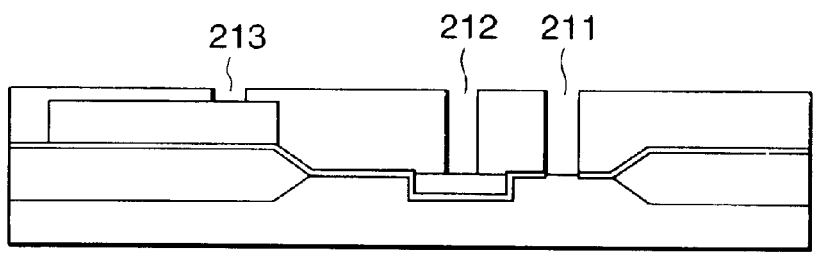
FIG. 3C is a process drawing showing the process after those shown in FIG. 2 in the manufacturing method, which is used to explain an embodiment of the present invention.
Figure 3D:
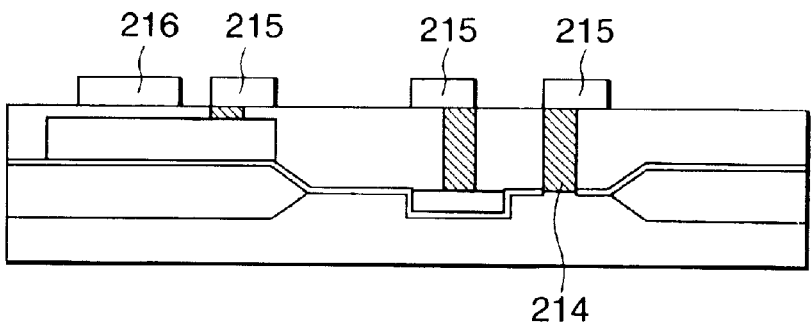
FIG. 3D is a process drawing showing the process after those shown in FIG. 2 in the manufacturing method, which is used to explain an embodiment of the present invention.

Subsequently, an interlayer insulating film 209 made of, for example, a SOG film is formed by the SOG (Spin on Glass) method (FIG. 3A), and the interlayer insulating film 209 is etched back to form a capacitor insulating film 210 (FIG. 3B). Thereafter, a contact hole 211 on an active region, a contact hole 212 on the gate electrode, and a contact hole 213 on the lower electrode of a capacitor are formed in the active region by means of the photolithography etching technique (FIG. 3C). Finally, after metal 214 such as tungsten is buried into the respective contact holes, a wiring layer 215 and an upper electrode of a capacitor 216 are formed (FIG. 3D).

As described above, in the embodiment of the present invention, a polycrystalline silicon film is deposited after forming a trench, and then, a gate electrode and a lower electrode of a capacitor are simultaneously formed. Therefore, it is possible to eliminate one process for forming the polycrystalline silicon. As a result, the simplification of the manufacturing process can be achieved, and also, the damages on the field oxide film can be prevented. In addition, the number of the thermal treatment processes is also reduced owing to the simplification of the process, and the control of the impurity diffusion in a transistor can be facilitated.

According to the present invention, a part of the polycrystalline silicon forming process can be eliminated, and also, the number of the thermal treatment processes can be reduced. Therefore, the control of the transistor characteristic is facilitated. As a result, the reliability of a semiconductor device having both the PIP capacitor and the MOS transistor is enhanced.

What is claimed is:

1. A method of manufacturing a capacitor and an MOS transistor comprising:
    forming an active region, and a device isolation region including a field oxide film, on a semiconductor substrate;
    forming a trench in the active region;
    forming a gate oxide film in the trench;
    depositing a polycrystalline silicon layer on the gate oxide film and the field oxide film;
    forming a mask on the polycrystalline silicon layer over the field oxide film;
    etching a part of the polycrystalline silicon layer using the mask so as to simultaneously form a lower electrode of the capacitor on the field oxide film and a buried gate electrode of the MOS transistor in the trench;
    forming an insulating film to cover the lower electrode and the buried gate electrode;
    planarizing the insulating film by an etch back method to leave the insulating film on the lower electrode of the capacitor; and
    forming an upper electrode on the planarized insulating film over the lower electrode.

2. A method of manufacturing a capacitor and an MOS transistor according to claim 1, wherein the insulating film is an SOG film.

3. A method of manufacturing a capacitor and an MOS transistor comprising:
    forming an active region, and a device isolation region including a field oxide film, on a semiconductor substrate;
    forming a trench in the active region;
    forming a gate oxide film in the trench;
    depositing a polycrystalline silicon layer on the gate oxide film and the field oxide film;
    etching the polycrystalline silicon layer on a portion of the device isolation region and on the active region by an etch back method using a mask, to simultaneously form a lower electrode of the capacitor on the device isolation region and a buried gate electrode of the MOS transistor in the trench;
    forming an insulating film to cover the lower electrode and the buried gate electrode;
    planarizing the insulating film by an etch back method to leave the insulating film on the lower electrode of the capacitor; and
    forming an upper electrode on the planarized insulating film over the lower electrode.

4. A method of manufacturing a capacitor and an MOS transistor according to claim 3, wherein the insulating film is an SOG film.

5. A method of manufacturing a capacitor and an MOS transistor according to claim 1, further comprising doping impurities into the polycrystalline silicon layer.

6. A method of manufacturing a capacitor and an MOS transistor according to claim 3, further comprising doping impurities into the polycrystalline silicon layer.

7. A method of manufacturing a capacitor and an MOS transistor according to claim 1, further comprising:
    forming a plurality of contact holes in the insulating film so as to expose the lower electrode, the buried gate electrode, and a source or a drain of the MOS transistor; and
    filling a conductive material into the contact holes.

8. A method of manufacturing a capacitor and an MOS transistor according to claim 3, further comprising:
    forming a plurality of contact holes in the insulating film so as to expose the lower electrode, the buried gate electrode, and a source or a drain of the MOS transistor; and
    filling a conductive material into the contact holes.

9. A method of manufacturing a capacitor and an MOS transistor according to claim 1, wherein a thickness of the buried gate electrode is different than a thickness of the lower electrode.

10. A method of manufacturing a capacitor and an MOS transistor according to claim 3, wherein a thickness of the buried gate electrode is different than a thickness of the lower electrode.

11. A method of manufacturing a semiconductor device comprising:
    providing a semiconductor substrate having an active region and a device isolation region;
    forming a field oxide film on the device isolation region;
    forming a trench in the active region;

forming a gate insulating film on the trench;

forming a polycrystalline silicon layer on the gate insulating layer within the device isolation region;

forming a mask pattern on the polycrystalline silicon layer within the device isolation region;

etching back the polycrystalline silicon layer using the mask pattern so as to form a lower electrode pattern on the field oxide film and a buried gate electrode in the trench; and forming an insulation film to cover the lower electrode and the buried gate electrode formed during said etching; and forming an upper electrode on the insulation film over the lower electrode.

12. A method of manufacturing a semiconductor device according to claim 11, wherein the semiconductor device comprises an MOS transistor including the buried gate electrode and a capacitor including the lower and upper electrodes.

13. A method of manufacturing a semiconductor device according to claim 11, further comprising etching back the insulation film, to leave the insulation film on the lower electrode.

14. A method of manufacturing a semiconductor device according to claim 11, wherein the insulation film is an SOG film.

15. A method of manufacturing a semiconductor device according to claim 11, further comprising doping impurities into the polycrystalline silicon layer.

16. A method of manufacturing a semiconductor device according to claim 12, further comprising:

forming a plurality of contact holes in the insulation film so as to expose the lower electrode, the buried gate electrode, and a source or a drain of the MOS transistor; and filling a conductive material into the contact holes.

17. A method of manufacturing a semiconductor device according to claim 11, wherein a thickness of the buried gate electrode is different than a thickness of the lower electrode.

18. A method of manufacturing a semiconductor device according to claim 17, wherein the thickness of the buried gate electrode is smaller than the thickness of the lower electrode.

* * * * *